(12) United States Patent
Fang

(10) Patent No.: US 8,915,368 B2
(45) Date of Patent: Dec. 23, 2014

(54) LCD GLASS SUBSTRATE STORAGE TRAY

(71) Applicant: Shenzhen China Star Optoelectronics Technology Co., Ltd, Shenzhen (CN)

(72) Inventor: Rui Fang, Shenzhen (CN)

( * ) Notice: Subject to any disclaimer, the term of this patent is extended or adjusted under 35 U.S.C. 154(b) by 20 days.

(21) Appl. No.: 13/643,078

(22) PCT Filed: Sep. 24, 2012

(86) PCT No.: PCT/CN2012/081847
§ 371 (c)(1),
(2), (4) Date: Oct. 23, 2012

(87) PCT Pub. No.: WO2014/043919
PCT Pub. Date: Mar. 27, 2014

(65) Prior Publication Data
US 2014/0076771 A1 Mar. 20, 2014

(30) Foreign Application Priority Data
Sep. 20, 2012 (CN) .......................... 2012 1 0351918

(51) Int. Cl.
| | |
|---|---|
| B65D 85/00 | (2006.01) |
| B65D 81/18 | (2006.01) |
| B65D 81/02 | (2006.01) |
| B65D 85/48 | (2006.01) |
| H01L 21/673 | (2006.01) |

(52) U.S. Cl.
CPC ............... B65D 81/18 (2013.01); B65D 81/02 (2013.01); B65D 85/48 (2013.01); H01L 21/67363 (2013.01); H01L 21/67373 (2013.01); Y10S 414/135 (2013.01); Y10S 414/14 (2013.01)

USPC ........... 206/454; 206/710; 414/411; 414/935; 414/940; 414/222.02

(58) Field of Classification Search
USPC .......... 206/454, 710, 818, 711, 509; 414/411, 414/935, 940, 222.02
See application file for complete search history.

(56) References Cited

U.S. PATENT DOCUMENTS

| | | | | |
|---|---|---|---|---|
| 5,024,329 | A | * | 6/1991 | Grohrock ...................... 206/710 |
| 5,177,469 | A | * | 1/1993 | Igarashi et al. ................ 340/673 |
| 5,363,867 | A | * | 11/1994 | Kawano et al. .............. 134/95.2 |
| 5,378,107 | A | * | 1/1995 | Vierny et al. .................... 414/810 |
| 5,668,452 | A | * | 9/1997 | Villarreal et al. ........ 318/568.16 |

(Continued)

FOREIGN PATENT DOCUMENTS

| | | |
|---|---|---|
| CN | 2081823 U | 7/1991 |
| CN | 1176921 A | 3/1998 |

(Continued)

OTHER PUBLICATIONS

Li Weiwei, the International Searching Authority written comments, Jul. 2013, CN.

*Primary Examiner* — Mickey Yu
*Assistant Examiner* — Gideon Weinerth

(57) ABSTRACT

A liquid crystal display (LCD) glass substrate storage tray includes a frame. Each surface of the frame is configured with a plate, the frame and the plates enclose to form a closed box, and the plate on surface of the frame where an opening for the LCD glass substrate to be selected and placed is located forms a box door that is installable or removable from the frame.

8 Claims, 2 Drawing Sheets

(56) References Cited

U.S. PATENT DOCUMENTS

| | | | |
|---|---|---|---|
| 5,785,186 A * | 7/1998 | Babbs et al. | 211/41.18 |
| 5,810,537 A * | 9/1998 | Briner et al. | 414/217.1 |
| 6,105,782 A * | 8/2000 | Fujimori et al. | 206/710 |
| 6,124,792 A * | 9/2000 | Shoen et al. | 340/545.2 |
| 6,398,475 B1 * | 6/2002 | Ishikawa | 414/217 |
| 6,461,094 B1 * | 10/2002 | Mages et al. | 414/217 |
| 6,502,869 B1 * | 1/2003 | Rosenquist et al. | 292/59 |
| 6,530,736 B2 * | 3/2003 | Rosenquist | 414/411 |
| 6,641,348 B1 * | 11/2003 | Schultz et al. | 414/217 |
| 6,745,901 B2 * | 6/2004 | Chen et al. | 206/711 |
| 6,779,667 B2 * | 8/2004 | Nigg et al. | 206/711 |
| 6,896,470 B1 * | 5/2005 | Chen et al. | 414/411 |
| 7,232,037 B2 * | 6/2007 | Jang | 211/41.14 |
| 7,316,325 B2 * | 1/2008 | Burns et al. | 211/41.18 |
| 7,538,672 B2 * | 5/2009 | Lockyer et al. | 340/545.6 |
| 7,607,880 B2 * | 10/2009 | Okabe et al. | 414/217.1 |
| 7,665,787 B2 * | 2/2010 | Obayashi | 294/103.1 |
| 7,692,542 B2 * | 4/2010 | Outzs | 340/547 |
| 7,886,910 B2 * | 2/2011 | Bores et al. | 206/710 |
| 7,909,167 B2 * | 3/2011 | Chiu et al. | 206/710 |
| 7,916,019 B2 * | 3/2011 | Vial et al. | 340/545.1 |
| 7,976,262 B2 * | 7/2011 | Yokoyama | 414/411 |
| 8,029,224 B2 * | 10/2011 | Abe et al. | 414/217 |
| 8,328,495 B2 * | 12/2012 | Bufano et al. | 414/288 |
| 8,342,327 B1 * | 1/2013 | Nam et al. | 206/454 |
| 8,436,628 B2 * | 5/2013 | Uhov et al. | 324/661 |
| 8,821,099 B2 * | 9/2014 | Hall et al. | 414/222.01 |
| 2002/0038773 A1 * | 4/2002 | Fujimori et al. | 206/454 |
| 2003/0035713 A1 * | 2/2003 | Tsai et al. | 414/800 |
| 2004/0119588 A1 * | 6/2004 | Marks | 340/539.1 |
| 2006/0272169 A1 * | 12/2006 | Miyajima | 34/211 |
| 2007/0023322 A1 * | 2/2007 | Hyun et al. | 206/711 |
| 2007/0175792 A1 * | 8/2007 | Gregerson | 206/711 |
| 2007/0297884 A1 * | 12/2007 | Jung | 414/411 |
| 2008/0107507 A1 * | 5/2008 | Bufano et al. | 414/217.1 |
| 2008/0112784 A1 * | 5/2008 | Rogers et al. | 414/411 |
| 2009/0035666 A1 * | 2/2009 | Kurikawa | 430/5 |
| 2009/0245981 A1 * | 10/2009 | Miyajima et al. | 414/222.02 |
| 2009/0321306 A1 * | 12/2009 | Rider et al. | 206/719 |
| 2010/0126905 A1 * | 5/2010 | Lin | 206/710 |
| 2010/0279438 A1 * | 11/2010 | An et al. | 438/14 |
| 2010/0282638 A1 * | 11/2010 | Chiu et al. | 206/710 |
| 2011/0220545 A1 * | 9/2011 | Ra et al. | 206/711 |
| 2012/0180390 A1 * | 7/2012 | Goodman et al. | 49/13 |
| 2013/0028687 A1 * | 1/2013 | Takahashi et al. | 414/160 |
| 2014/0178162 A1 * | 6/2014 | Morikawa et al. | 414/416.08 |

FOREIGN PATENT DOCUMENTS

| | | | | |
|---|---|---|---|---|
| CN | 1989050 A | | 6/2007 | |
| CN | 200981729 Y | | 11/2007 | |
| JP | 2004111723 A | | 4/2004 | |
| JP | 2008-177418 A | | 7/2008 | |
| JP | 4284895 B2 | | 6/2009 | |
| KR | 10-2011-0067537 | * | 7/2011 | A45C 13/10 |
| TW | 200403179 A | | 3/2004 | |

* cited by examiner

LCD GLASS SUBSTRATE STORAGE TRAY

TECHNICAL FIELD

The present disclosure relates to manufacturing field of liquid crystal display (LCD) products, and more particularly to an LCD glass substrate storage tray.

BACKGROUND

With liquid crystal display (LCD) panel manufacturing technology becoming more mature, and resolution of LCD panels becoming higher, cleanliness of LCD panels becomes more important. In the prior art, LCD glass substrates are generally stored on storage trays. The storage trays that are for online production and the storage trays that temporarily store LCD glass substrates both open structures and are unsealed, so that environmental dust is easy to fall onto the LCD glass substrates. Thus, a clean step is performed before each manufacturing LCD glass substrates process and the burden of cleaning equipment is heavy. When cleaning equipment may not completely remove all dust, bad conditions such as short circuits, circuit malfunction, and abnormal film surface may occur.

SUMMARY

In view of the above-described problems, the aim of the present disclosure is to provide a liquid crystal display (LCD) glass substrate storage tray capable of reducing environmental dust.

A first technical scheme of the present disclosure is that an LCD glass substrate storage tray comprises a frame. Each surface of the frame is configured with a plate, the frame and the plates enclose to form a closed box, the plate on the surface of the frame where an opening for the LCD glass substrate to be selected and placed is located forms a box door that is installable or removable from the frame. The box door is configured with magnets, the frame is correspondingly configured with magnets or iron blocks, the box door is attached to the frame via magnetic force. The magnets are arranged at the four corners of the box door, the box door is made of a transparent material, and the box door is configured with a handle. The LCD glass substrate storage tray further comprises a base and a top frame. The box is placed on the base, and the top frame is positioned higher than the box. The top frame is configured with a first inductor, the base is configured with a second inductor, the first inductor vertically corresponds to the second inductor, and the handle is arranged between the first inductor and the second inductor, to block the induction between the first inductor and the second inductor.

A second technical scheme of the present disclosure is that: an LCD glass substrate storage tray comprises a frame. Each surface of the frame is configured with a plate, the frame and the plates enclose to form a closed box, and the plate on the surface of the frame where an opening for the LCD glass substrate to be selected and placed is located forms a box door that is installable or removable.

In one example, the box door is configured with magnets, the frame is correspondingly configured with magnets or iron blocks, and the box door is attached to the frame via magnetic force.

In one example, the box door is configured with magnets, the frame is made of iron, and the box door is attached to the frame via magnetic force.

In one example, the box door is configured with iron blocks, the frame is correspondingly configured with magnets, and the box door is attached to the frame via magnetic force.

In one example, the magnets are arranged at the four corners of the box door. To order for the door box to be firmly attached to the frame. Because the door box is uniformly stressed, sealing performance between the box door and the frame is improved.

In one example, the iron blocks are arranged at the four corners of the box door.

In one example, the box door is made of a transparent material. People may see the inside of the box from the outside, and know how many LCD glass substrate(s) are inside the box.

In one example, the box door is configured with a handle.

In one example, the LCD glass substrate storage tray further comprises a base and a top frame. The closed box is placed on the base, and the top frame is positioned higher than the box.

In one example, the top frame is configured with an upper inductor, the base is configured with a lower inductor, the first inductor vertically corresponds to the second inductor, and a handle is arranged between the first inductor and the second inductor, to block the induction between the first inductor and the second inductor. When the LCD glass substrate storage tray is in online production, if the box door is not removable, the induction between the upper inductor and the lower inductor is blocked, and an alarm is given by an alarm device according to the block of induction at this moment, to remind the operator to remove the box door.

Advantages of the present disclosure are summarized below: the LCD glass substrate storage tray of the present disclosure comprises a frame and plates arranged on all the surfaces of the frame. The frame and the plates enclose to form a closed box. Because LCD glass substrate is placed in the closed box instead of being placed in open environment, dust may be significantly reduced. Thus, burden of the cleaning equipment is reduced, and LCD glass substrates product yield is increased. The plate on the surface of the frame where an opening for the LCD glass substrate to be selected and placed is located is installable or removable, namely form the box door that is installable or removable from the frame. When not selecting and placing LCD glass substrate, the door box is installable so that the box is completely closed; when selecting and placing LCD glass substrate, the door box is removed, at this moment, other plates except the box door may still prevent dust from falling onto the LCD glass substrate.

DETAILED DESCRIPTION

Figure 1:
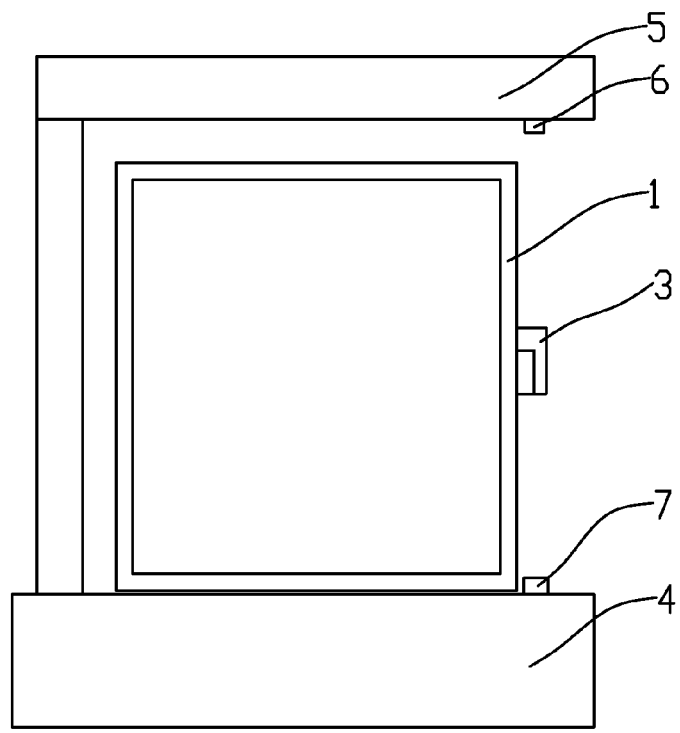
FIG. 1 is a structural diagram of an example of an LCD glass substrate storage tray of the present disclosure.
Figure 2:
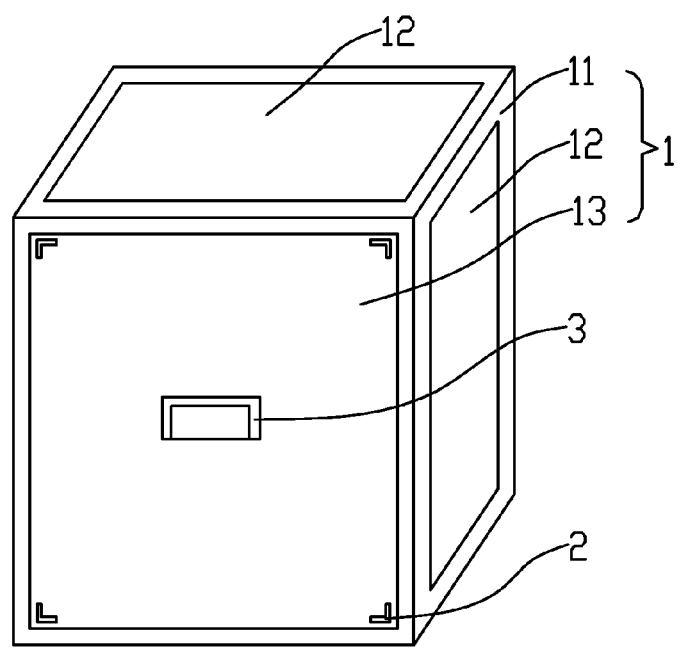
FIG. 2 is a structural diagram of an LCD glass substrate storage tray when a door box is installed of the present disclosure.
Figure 3:
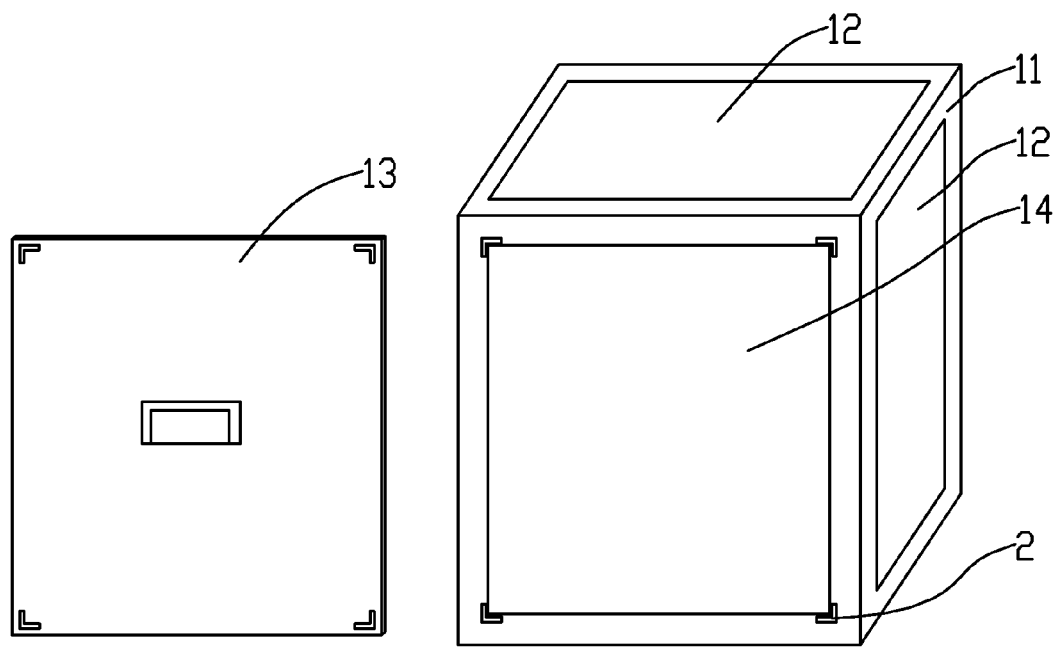
FIG. 3 is a structural diagram of an LCD glass substrate storage tray when a door box is removed of the present disclosure.

The present disclosure provides a liquid crystal display (LCD) glass substrate storage tray. As shown from FIG. 1 to FIG. 3, as an example, the LCD glass substrate storage tray of the present disclosure comprises a frame 11. Each surface of the frame 11 is configured with a plate 12, where the frame 11 and the plates 12 enclose to form a closed box 1. The plate 12 on the surface of the frame where an opening 14 for the LCD glass substrate to be selected and placed is located forms a box door 13 that is installed or removed from the frame.

The LCD glass substrate storage tray of the present disclosure comprises the frame 11 and the plates 12 arranged on all the surfaces of the frame 11. The frame 11 and the plates 12 enclose to form a closed box 1. Because LCD glass substrate is placed in the closed box instead of being placed in an open environment, dust is significantly reduced. Thus, burden of the cleaning equipment is reduced, and LCD glass substrate production yield is increased. The plate 12 on the surface of the frame where an opening 14 for the LCD glass substrate to be selected and placed is located can be installed or removed, namely from the box door 13 is installable or removable from the frame. When not selecting and placing LCD glass substrate(s), the door box 13 is installable so that the box 1 is completely closed; when selecting and placing LCD glass substrate(s), the door box 13 is removable. At this moment, other plates 12 except the box door 13 may prevent dust from falling onto the LCD glass substrate.

In the example, the door box 13 is configured with magnets 2, the frame 11 is correspondingly configured with magnets 2, and the box door 13 is attached to the frame 11 via magnetic force. The box door is configured with a handle 3, and the box door 13 is conveniently installed or removed, without using other tools when manually pulling the handle 3. Typical pivot doors occupy a certain space when opening, possibly affecting the normal operation of existing equipment, while the present disclosure is basically the same as the original design after removing the box door 13, having no effect on normal operation of existing equipment.

Because magnetic force exists between magnets, and magnetic force further exists between magnet and iron objects. Thus, the box door can be attached to the frame by arranging iron blocks on the frame after the magnets are arranged on the box door. If the frame is made of iron, magnets or iron blocks are not arranged on the frame. If iron blocks are arranged on the box door, magnets are correspondingly arranged on the frame, so that the box door may be attached to the frame via magnetic force.

In order for the box door 13 to be firmly attached to the frame 11, multiple magnets 2 or iron blocks are arranged on the box door 13 and are distributed at the four corners of the box door 13. Because the box door 13 is uniformly stressed, sealing performance between the box door 13 and the frame 11 is improved.

In the example, because the box door 13 is made of a transparent material, people may see inside of the box 1 from outside of the box door, and know how many LCD glass substrate are inside the box 1. If the plates 12 are all made of transparent material, people may see the inside of the box 1 from all sides of the closed box. Thus, the plates 12 have no effect on the existing process and the operator, but beneficially prevent dust from falling onto the LCD glass substrate.

In the example, the LCD glass substrate storage tray further comprises a base 4 and a top frame 5. The box 1 is placed on the base 4, and the top frame 5 is positioned higher than the box 1. The top frame 5 is configured with a first inductor 6, the base 4 is configured with a second inductor 7, the first inductor 6 vertically corresponds to the second inductor 7, and the handle 3 is arranged between the first inductor 6 and the second inductor 7, to block induction between the first inductor 6 and the second inductor 7. When the LCD glass substrate storage tray is put in a production line, if the door box 13 is not removable, the induction between the first inductor 6 and the second inductor 7 is blocked, and an alarm is given by an alarm device (not illustrated) according to the block of induction at this moment, to remind the operator to remove the door box, or the inductor(s) is linked with the manipulator to enable the manipulator not to perform the action of selecting and placing LCD glass substrate(s).

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

The invention claimed is:

1. A liquid crystal display (LCD) glass substrate storage tray, comprising:
a frame;
a base; and
a top frame;
wherein each surface of the frame is configured with a plate, the frame and the plates enclose to form a closed box; and
wherein the plate on the surface of the frame where an opening for the LCD glass substrate to be selected and placed is located forms a box door that is installable or removable from the frame;
wherein the box door is configured with magnets, the frame is correspondingly configured with magnets or iron blocks, the box door is attached to the frame via magnetic force;
wherein the magnets are arranged at four corners of the box door, the box door is made of a transparent material, and the box door is configured with a handle made from materials capable of blocking induction;
wherein the closed box is placed on the base, and the top frame is positioned higher than the box; the top frame is configured with a first inductor, the base is configured with a second inductor;
wherein the first inductor vertically corresponds to the second inductor, and the handle is arranged between the first inductor and the second inductor, to block induction between the first inductor and the second inductor.

2. A liquid crystal display (LCD) glass substrate storage tray, comprising:
a frame, wherein each surface of the frame is configured with a plate, the frame and the plates enclose to form a closed box, wherein the plate on the surface of the frame where an opening for the LCD glass substrate to be selected and placed is located forms a box door that is installable or removable from the frame,
wherein the box door is configured with a handle,
wherein the LCD glass substrate storage tray further comprises a base and a top frame; the closed box is placed on the base, and the top frame is positioned higher than the box
wherein the top frame is configured with a first inductor, the base is configured with a second inductor; wherein the first inductor vertically corresponds to the second inductor, the handle is made from materials capable of blocking induction, and the handle is arranged between the first inductor and the second inductor, to block the induction between the first inductor and the second inductor.

3. The LCD glass substrate storage tray of claim 2, wherein the box door is configured with magnets, the frame is correspondingly configured with magnets or iron blocks, and the box door is attached to the frame via magnetic force.

4. The LCD glass substrate storage tray of claim 2, wherein the box door is configured with magnets, the frame is made of iron, and the box door is attached to the frame via magnetic force.

5. The LCD glass substrate storage tray of claim 2, wherein the box door is configured with iron blocks, the frame is correspondingly configured with magnets, and the box door is attached to the frame via magnetic force.

6. The LCD glass substrate storage tray of claim 3, wherein the magnets are arranged at four corners of the box door.

7. The LCD glass substrate storage tray of claim 5, wherein the iron blocks are arranged at four corners of the box door.

8. The LCD glass substrate storage tray of claim 2, wherein the box door is made of a transparent material.

\* \* \* \* \*